United States Patent [19]

Balanson et al.

[11] 4,339,522
[45] Jul. 13, 1982

[54] ULTRA-VIOLET LITHOGRAPHIC RESIST COMPOSITION AND PROCESS

[75] Inventors: Richard D. Balanson, Morgan Hill; Nicholas J. Clecak; Barbara D. Grant, both of San Jose; Augustus C. Ouano, Santa Cruz, all of Calif.

[73] Assignee: International Business Machines Corporation, Armonk, N.Y.

[21] Appl. No.: 200,296

[22] Filed: Oct. 24, 1980

Related U.S. Application Data

[63] Continuation-in-part of Ser. No. 48,940, Jun. 18, 1979, abandoned.

[51] Int. Cl.$^3$ .................. G03C 1/54; G03C 5/00; G03C 1/72
[52] U.S. Cl. .................. 430/192; 430/193; 430/326; 524/108
[58] Field of Search .................. 430/192, 193, 326; 260/141 R, 141 D

[56] References Cited

U.S. PATENT DOCUMENTS

| | | | |
|---|---|---|---|
| 3,495,979 | 2/1970 | Lavidon et al. | 430/193 |
| 3,661,582 | 5/1972 | Broyde | 430/193 |
| 3,950,173 | 4/1976 | Ross | 430/193 |
| 4,093,461 | 6/1978 | Loprest | 430/193 |
| 4,123,279 | 10/1978 | Kobayashi | 430/193 |
| 4,207,107 | 6/1980 | Ross | 430/193 |
| 4,284,706 | 8/1981 | Clecok et al. | 430/193 |

OTHER PUBLICATIONS

Kammula, S. et al., J. Org. Chem., vol. 42, No. 17, pp. 2931–2932, 1977.
Dinaburg, M. S., "Photosensitive Diazo Compounds", Focal Press, pp. 31–32 and 181–182, 1964.

Primary Examiner—Charles L. Bowers, Jr.
Attorney, Agent, or Firm—Joseph G. Walsh

[57] ABSTRACT

Phenolic-aldehyde resins sensitized with Meldrum's diazo or a homologue thereof are useful as lithographic resists sensitive to deep ultra-violet light.

6 Claims, No Drawings

ULTRA-VIOLET LITHOGRAPHIC RESIST COMPOSITION AND PROCESS

The present application is a continuation-in-part of copending application Ser. No. 48,940 filed June 18, 1979, now abandoned.

TECHNICAL FIELD

The present invention is concerned with a lithographic resist sensitive to light in the deep ultra-violet region, that is to say, below 3000 Å, and with a process for its use. The resist comprises a phenolic-aldehyde resin and Meldrum's diazo or a homologue thereof as a sensitizer.

BACKGROUND ART

The material known as Meldrum's diazo is well known in the art. Its synthesis is shown in CHEM. BER 94 929 (1961). The systematic chemical name for the material is 2,2-dimethyl-4,6-diketo-5-diazo-1,3-dioxane and its formula is

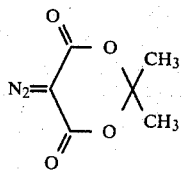

The solution photochemistry of Meldrum's diazo has been previously studied. J. Org. Chem. 42 2931 (1977).

U.S. Pat. Nos. 3,046,110 through 3,046,124 inclusive all are concerned with light sensitive printing plates using certain specified diazide sensitizers.

U.S. Pat. Nos. 3,852,771, 3,961,100 and 4,075,306 are concerned with use of certain diazide sensitizers in materials to be subjected to electron beams.

A study of factors influencing dissolution of irradiated resist is reported in *Polymer Engineering and Science*, Vol. 18, No. 4, p. 306 (1978).

DISCLOSURE OF THE INVENTION

According to the present invention, lithographic resists are provided which are sensitive in the deep ultra-violet range, that is, to light below 3000 Å in wavelength, while remaining insensitive to conventional U.V. (above 3000 Å) and visible light. The resists comprise phenolic-aldehyde resins and as a sensitizer, Meldrum's diazo or a suitable homologue.

The sensitizers useful in the present invention have the formula

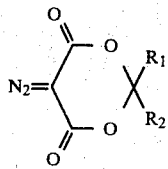

wherein $R_1$ is alkyl or aryl having up to 20 carbon atoms, $R_2$ is H, alkyl or aryl having up to 20 carbon atoms, or together $R_1$ and $R_2$ are cycloalkyl.

The resists in the present invention possess several desirable properties representing advantages over the prior art. They are easily handled in ordinary light. This is in contrast to conventional resists, for example those using as a sensitizer the well-known material ortho-naphthoquinonediazide, which must be worked with in the absence of ordinary ambient light. Furthermore, the resists of the present invention are thermally stable and offer significant improvement of resolution because shorter wavelength light is being used. They possess no absorption of light in the conventional U.V. range (above 3000 Å) and hence require no optical filters in order to achieve higher resolution images. This offers a significant sensitivity improvement compared to conventional U.V. resists which are active in the regions both above and below 3000 Å. According to the present invention, Meldrum's diazo or a suitable homologue is used in resists which comprise a resin of the phenolic-aldehyde type. Many such resins are known in the art. In particular, mention may be made of phenol-formaldehyde resin and cresol-formaldehyde resin.

It is still an additional advantage of the present invention that the resists may be formed readily by dissolving the resin and sensitizer in a common solution and casting a film onto an appropriate substrate. Upon imagewise irradiation with ultra-violet light, the sensitizer gives rise to photodestruction in the irradiated regions. The solubility of the film in the exposed regions is thereby increased relative to the unexposed regions. such photo-decomposition can conveniently be brought about with a medium pressure mercury light source or any other source having appreciable intensity at or near 2600 Å.

The composition of the present invention may be varied depending upon the particular application desired. In general, the sensitizer is present in from about 5 to 50% of the weight of the resin.

Casting solvents suitable for use in the present invention include, for example, such conventional solvents as diglyme, methyl isobutylketone and the like.

Following imagewise exposure to ultra-violet light, development takes place in the conventional manner, that is, treatment with aqueous alkaline development, for example, potassium hydroxide solution.

BEST MODE FOR CARRYING OUT THE INVENTION

A resist formulation was made from 0.71 grams of Meldrum's diazo and 1.64 grams of Varcum resin (Varcum is a Trademark of Reichold Chem. Co. for its Cresol-formaldehyde resin). The mixture of these ingredients was dissolved in 3.72 grams of methyl isobutylketone. Films were cast on silicon wafers which were then prebaked at 80° C. to a thickness of approximately 1.5μ. The films were exposed through a quartz mask and developed with dilute aqueous potassium hydroxide. Extremely fine line resolution of less than 2μ was obtained. Line resolution appears to be limited by factors other than the resist composition. It should be noted that this experiment was carried out in ordinary ambient light. This is one of the advantages of the present invention, and is in sharp contrast to conventional sensitizers such as a naphthoquinonediazide. When an attempt was made to use such a sensitizer in the above manner, the ambient light degraded the image quality, and the long wavelength absorption degraded the resolution, which was greater than 2μ. When the experiment was carried out with a naphthoquinonediazide sensitizer using yellow ambient light and an appropriate ultra violet filter such that fine line resolution can be realized (e.g. 240 <λ<260) the length of exposure required is five-fold over that for Meldrum's diazo. Still an additional advantage of the Meldrum's diazo compared to the naphthoquinonediazide of the prior art lies in the bleaching characteristic of the materials. With Meldrum's diazo, vertical profiles are obtained; with the prior art material naphthoquinonediazide, underexposed profiles are obtained.

In summary, compared to the prior art, the present invention gives greater ease of use with no requirement to restrict ambient light and no need for filters, greater resolution, shorter exposure time, and vertical profiles.

As stated above, Meldrum's diazo and its homologues may be prepared by known procedures and from materials known in the literature, using the appropriate chain length starting materials. The following procedures are given as examples.

Preparation of 2-n-heptyl, 2-methyl-4,6-diketo-5-diazo-1,3-dioxane:

In a 250 ml round bottom flask was placed 2-nonanone (28.45 g, 200 m mol), acetic anhydride (20.4 g, 200 m mol) and malonic acid (20.8 g, 200 m mol). This suspension was warmed gently on a steam bath and 20 ml of ethyl acetate was added to achieve a homogeneous sollution. After cooling to room temperature, 4 drops of concentrated perchloric acid was added and the reaction stirred overnight. The ethyl acetate was removed by rotary evaporation and the residue dissolved with warming in isopropanol (~100 ml). After cooling the solid was isolated by filtration (20.7 g, 48%). To a solution of 2.56 g of this sollid in 40 ml absolute ethanol was added dropwise 1.0 g triethylamine. The solution was cooled to −15° C. and tosyl azide (1.97 g) was added slowly maintaining the reaction temperature below −10° C. After one hour the reaction was cooled in a freezer and the product collected as a solid by filtration. Recrystallization ws effected from ethanol.

Preparation of 2-methyl,2-n-octadecyl-4,6-diketo-5-diazo-1,3-dioxane:

The compound 2-ketononadecanone (2.82 g) was converted in the same manner as above, employing malonic acid (1.04 g) and acetic anhydride (1.02 g). The resulting solid (1.64 g) was diazotized as above employing triethylamine (0.5 g) and tosyl azide (1.0 g).

We claim:

1. A lithographic resist composition for use with ultraviolet light of less than 3,000 Å wavelength, said composition comprising a phenolic-aldehyde resin and in admixture therewith as a deep ultra-violet sensitizer, a sufficient quantity of compound having the formula

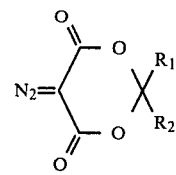

wherein $R_1$ is alkyl or aryl having up to 20 carbon atoms, $R_2$ is H, alkyl or aryl having up to 20 carbon atoms, or together $R_1$ and $R_2$ are cycloalkyl whereby upon exposure to deep ultra-violet radiation, the composition becomes more soluble in alkaline developer.

2. A composition as claimed in claim 1 wherein the sensitizer is present in an amount of from about 5 to about 50% by weight of the resin.

3. A composition as claimed in claim 1 wherein the resin is a cresol-formaldehyde resin.

4. A process for forming a lithographic resist image comprising image-wise exposing to ultra-violet light of less than 3000 Å wavelength a film cast on a substrate and comprising a phenolic-aldehyde resin and in admixture therewith a sensitizer having the formula

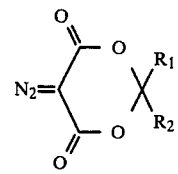

wherein $R_1$ is alkyl or aryl having up to 20 carbon atoms, $R_2$ is H, alkyl or aryl having up to 20 carbon atoms, or together $R_1$ and $R_2$ are cycloalkyl, and dissolving the exposed portion of said film with aqueous alkali.

5. A process as claimed in claim 4 wherein the resin is cresol-formaldehyde.

6. A process as claimed in claim 4 wherein the sensitizer is present in an amount of from about 5 to about 50% by weight of the resin.

* * * * *